United States Patent [19]

Fujinami et al.

[11] Patent Number: 5,412,802
[45] Date of Patent: May 2, 1995

[54] REASONING METHOD AND FAULT DIAGNOSIS METHOD AND SYSTEM IMPLEMENTING THE SAME

[75] Inventors: Tsutomu Fujinami, Kawasaki; Kouji Inoue, Yokohama; Hiroshi Tsuji, Itami; Keiichiro Renge, Yokohama; Kenzo Moriyama, Fujisawa; Kenji Tozuka, Yokohama, all of Japan

[73] Assignees: Hitachi, Ltd., Tokyo; Hitachi Touhoku Software, Ltd., Miyagi, both of Japan

[21] Appl. No.: 695,928

[22] Filed: May 6, 1991

[30] Foreign Application Priority Data

May 11, 1990 [JP] Japan ................................ 2-122393

[51] Int. Cl.$^6$ ............................................ G01R 31/28
[52] U.S. Cl. ............................ 395/575; 371/15.1; 395/64
[58] Field of Search .............. 371/15.1; 395/911, 912, 395/913, 914, 915, 916, 917, 918, 64, 575, 50, 51, 52; 364/274.3, 274.5

[56] References Cited

U.S. PATENT DOCUMENTS

| | | | |
|---|---|---|---|
| 4,649,515 | 3/1987 | Thompson | 371/15.1 X |
| 4,783,752 | 11/1988 | Kaplan | 395/64 |
| 4,847,784 | 7/1989 | Clancey | 364/513 |
| 4,866,635 | 9/1989 | Kahn | 364/900 X |
| 4,939,680 | 7/1990 | Yoshida | 364/513 |
| 4,964,060 | 10/1990 | Hartsog | 364/512 |
| 5,016,204 | 5/1991 | Simoudis | 364/578 |
| 5,047,951 | 9/1991 | Ono | 395/64 |
| 5,072,406 | 12/1991 | Ammon | 395/64 |
| 5,107,497 | 4/1992 | Lirov | 371/15.1 |
| 5,109,380 | 4/1992 | Ogino | 371/15.1 |
| 5,111,384 | 6/1992 | Aslanian | 371/15.1 X |
| 5,127,005 | 6/1992 | Oda | 371/15.1 |

OTHER PUBLICATIONS

Cinque et al.; Use of Meta-Knowledge in an Expert System; Apr. 1989; pp. 176-180.

Knowledge Management: An Abstraction of Knowledge Base and Database Management Systems; Riedesel; 1990; pp. 80-86.

Michael R. Genesereth, "An Overview of Meta-Level Architecture", AAAI Preliminary Proceedings, 1983, pp. 119-124. (Provided in English).

Primary Examiner—Robert W. Beausoliel, Jr.
Assistant Examiner—Glenn Snyder
Attorney, Agent, or Firm—Fay, Sharpe, Beall, Fagan, Minnich & McKee

[57] ABSTRACT

A reasoning method capable of easily describing a model of diagnosis, a diagnosis method based on the reasoning method and a fault diagnosis system for performing efficiently faulty component diagnosis. Basic knowledge of a domain for which a knowledge base is used, expert's heuristic knowledge and meta-level knowledge for determining a scheme of use of the basic knowledge and the heuristic knowledge are provided. Fault diagnosis is performed for an objective of interest by executing a combination of reasoning based on the basic knowledge and reasoning based on the heuristic knowledge, in accordance with the meta-level knowledge.

2 Claims, 12 Drawing Sheets

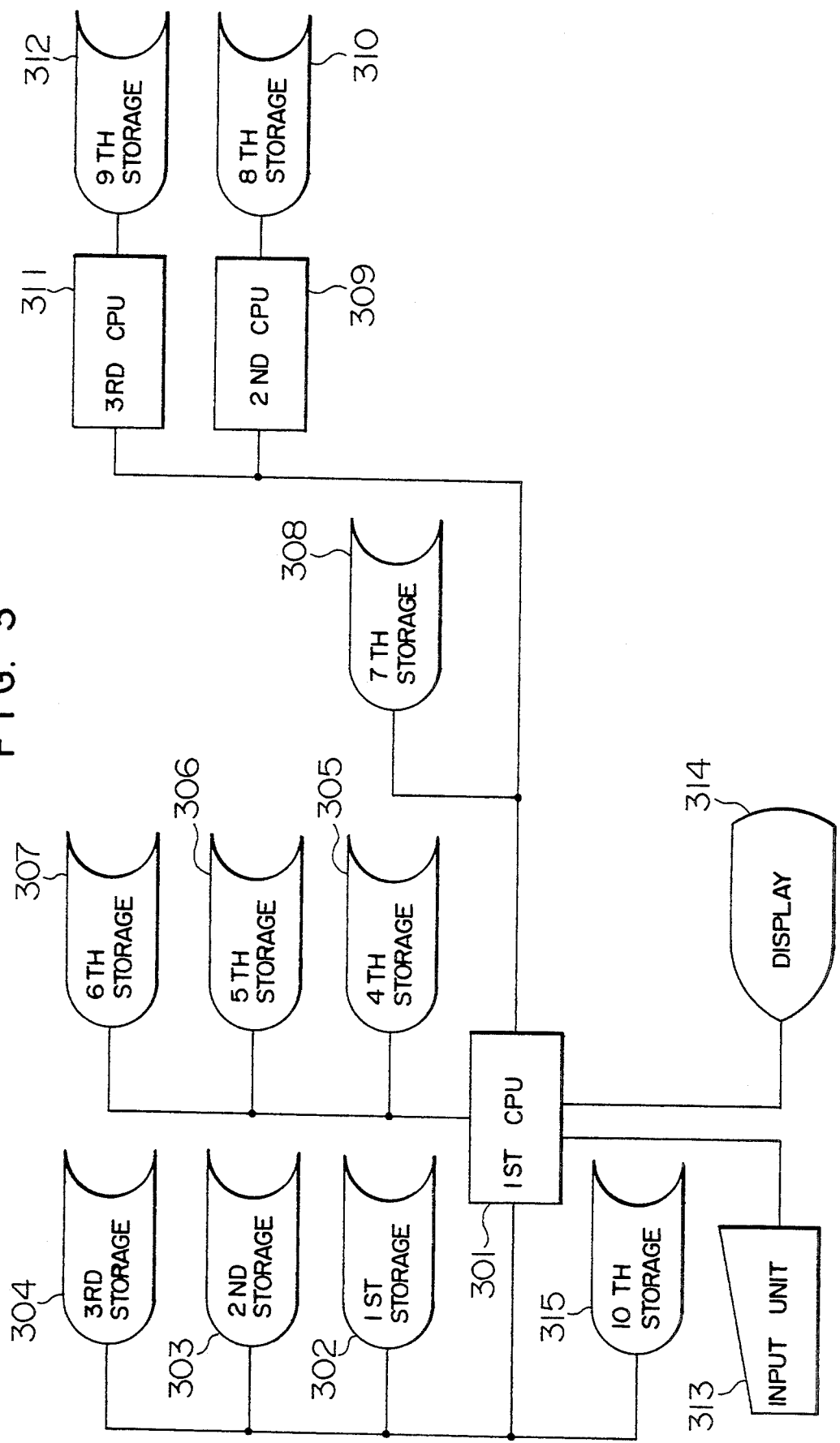

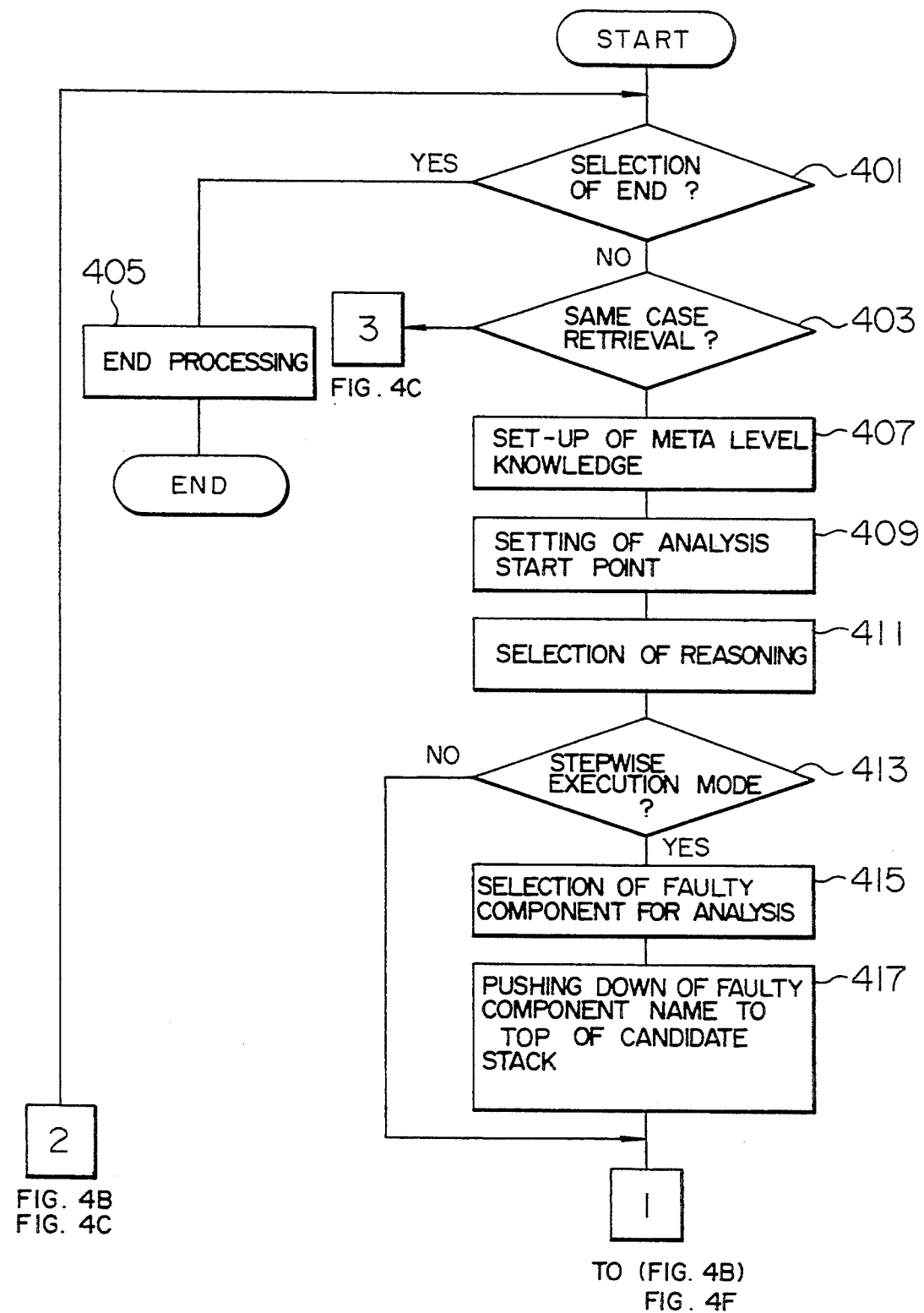

SHORTCUT REASONING

SAME CASE RETRIEVAL

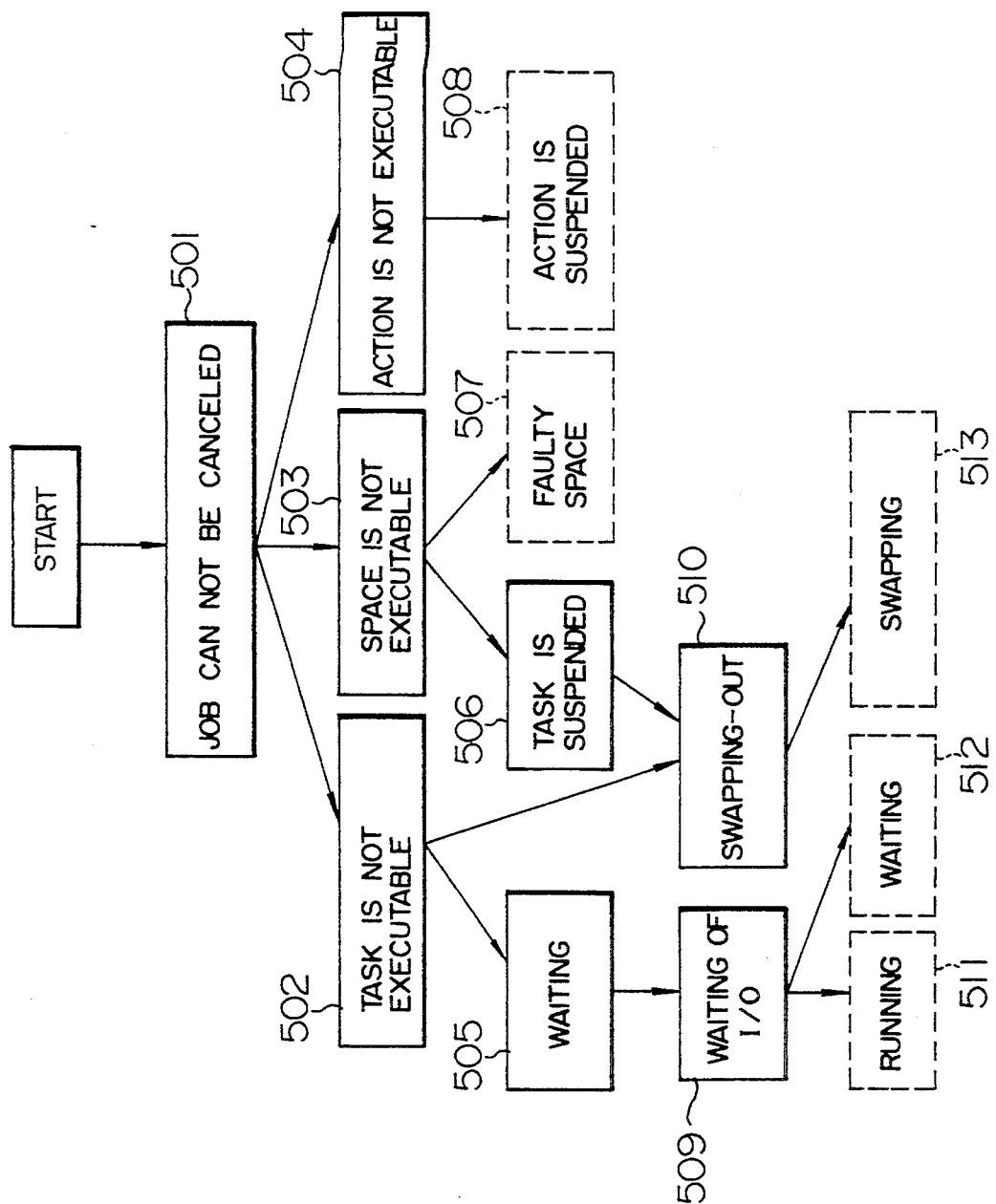

FIG. 7

| TABLE NAME/COLUMN NAME | a | b | c | d |
|---|---|---|---|---|
| 1 | 0 | 1 | 1 | 1 |
| 2 | 1 | 0 | 0 | 0 |
| 3 | 1 | 0 | 1 | 1 |

FIG. 8A

| TABLE NAME/COLUMN NAME | a | b | c | d |
|---|---|---|---|---|
| 1 | 0 | 1 | 1 | 1 |
| 2 | 1 | 0 | 0 | 0 |
| 3 | 1 | 0 | 1 | 1 |

FIG. 8B

| ITEM | CONTENT |
|---|---|
| PROGRAM NAME | CALCULATION OF SALARY |
| NAME OF HARDWARE | M-666 |

FIG. 9

| TABLE NAME / COLUMN NAME | a | b | c | d |
|---|---|---|---|---|
| 1 | 0 | - | 1 | 1 |
| 2 | 1 | 0 | 0 | 0 |
| 3 | 1 | 0 | 1 | 1 |

FIG. 10

| TABLE NAME / COLUMN NAME | a | b | c | d |
|---|---|---|---|---|
| 1 | 0 | 0 | 0 | 0 |
| 2 | 0 | 1 | 1 | 1 |
| 3 | 1 | 0 | 1 | 0 |

REASONING METHOD AND FAULT DIAGNOSIS METHOD AND SYSTEM IMPLEMENTING THE SAME

BACKGROUND OF THE INVENTION

The present invention generally relates to a reasoning or an inference technique. More particularly, the present invention is related to a method and a system for performing fault diagnosis to identify trouble or a fault in a machine and/or software operated for controlling the machine. In this context, the machine or software to be diagnosed may also be termed an objective, in a more general sense.

In recent years, expert systems have been developed to a state capable of being put to practical use and have found extensive applications. The expert system is a program which is designed to run on a computer system for making use of the expertise acquired from an expert and placed in a knowledge base. In the case of the application program known heretofore, knowledge for solving a problem is incorporated as an integral part of the program. In contrast, in the expert system, a model for solving a problem is provided in the form of a knowledge base.

Many of the expert systems are implemented as production systems for describing expert's problem solving models by rules each composed of a conditional part and an execution part. However, the prior art production system suffers a shortcoming in that difficulty is encountered in describing the problem solving model for solving a complicated problem such as a fault diagnosis or trouble shooting in a large scale computer system and the like.

As an approach for avoiding such difficulty, a method of dividing a problem solving model into several levels has been proposed. By way of example, M. R. Gensereth teaches in the article entitled "An Overview of Meta-Level Architecture", AAAI Preliminary Proceedings, pp. 119-124 (1983), a method of dividing a problem solving model into two levels, i.e. a base level and a meta level. In the base level, a series of processings are executed for reaching a goal, while the meta level is a hierarchically higher level serving for determining which of the processings belonging to the base level to execute. In the expert system based on the production system, meta level rules are introduced for performing the processings of the meta level, wherein a plurality of rules are grouped to one rule set and the reasoning is controlled by the meta-level rules such that it is performed by using an appropriate one of the rule sets. The processings at the base level correspond to executions of the individual rules of the rule set, respectively.

In the prior art problem solving method mentioned above, the concept of dividing the problem solving model into levels has certainly been adopted. It is however insufficient to divide the problem solving model into only two levels of the base level and the meta level. This is because the model for the problem solving differs from one to another domain to which the expert system is applied and there exists such application where the model is composed of more than two levels.

Consider, for example, a trouble shooting or fault diagnosis processing. In this case, three levels mentioned below may well be taken into account.

(1) Execution of the fault diagnosis on the basis of the principle underlying the operation or function of a machine or objective of concern.

(2) Execution of the diagnosis on the basis of experience or heuristic knowledge of an expert while considering features which the objective exhibits.

(3) Execution of diagnosis by modifying the diagnosing process in consideration of the situations or states encountered in the course of the diagnosis.

At this juncture, let's assume that the knowledges involved in the fault diagnoses (1) and (2) are to be handled as the knowledges both belonging to one and the same base level. Then, there will coexist at the same level the typical or standardized diagnosis procedures and the heuristic knowledges, which of course gives rise to a problem that the knowledge base becomes difficult in preparation and maintenance thereof. Further, although introduction of a hierarchically high level can certainly facilitate the reasoning control, there arises a problem that overhead involved in the reasoning control is increased, as the knowledge of the high level increases.

SUMMARY OF THE INVENTION

It is therefore an object of the present invention to overcome the problems of the prior art techniques discussed above and provide a reasoning method as well as a diagnosis method based thereon which is capable of conveniently describing models for fault diagnosis and the like.

Another object of the present invention is to provide a fault diagnosis (or problem shooting) system which is capable of performing efficient and effective fault diagnosis while reducing overhead involved in the reasoning control due to introduction of the knowledge level concept.

In view of the above and other objects which will become apparent as description proceeds, there is provided according to an aspect of the present invention a reasoning method performed with the aid of a knowledge base system which includes a knowledge base storing expertise acquired from an expert and which is used in a computer system, the reasoning method comprising a step of providing the above-mentioned knowledge base system with a basic knowledge of a domain in which the knowledge base system is to be utilized, heuristic knowledge of the expert and meta level knowledge for determining a method of use of the heuristic knowledge and the basic knowledge, and a step of executing a reasoning on an objective of concern through a combination of a reasoning based on the use of the basic knowledge and a reasoning based on the use of the heuristic knowledge in accordance with the meta level knowledge.

It is also contemplated by the present invention to provide a fault diagnosis or trouble shooting method which is based on the reasoning method described above.

According to another aspect of the invention there is further provided a fault diagnosis system which comprises a problem localizing unit including a first storage for storing problem localizing knowledge as basic knowledge and a problem localizing agent for identifying stepwise a faulty component convergently by using the problem localizing knowledge and data of an objective under diagnosis, a reasoning unit including a second storage storing expert's heuristic knowledge for the fault diagnosis and a shortcut reasoning agent for localizing the faulty component by omitting intermediate steps of those included in the diagnosis process by using the expert's heuristic knowledge, a meta level diagnosis agent coupled to the problem localizing unit and the shortcut reasoning unit for determining whether the shortcut reasoning by the shortcut reasoning agent is to be adopted or not on the basis of meta level knowledge provided for determining the method of use of the heuristic knowledge and the basic knowledge, and processors provided independently for implementing the problem localizing unit, the shortcut reasoning unit and the meta-level diagnosis agent, respectively.

According to a further aspect of the invention, there is provided a fault diagnosis system which comprises a problem localizing agent for identifying convergently a faulty component in a stepwise manner by using problem localizing knowledge and data of an objective under diagnosis, a shortcut reasoning agent for localizing the faulty component by omitting intermediate steps of those involved in the diagnosis process with the aid of heuristic knowledge, a meta-level diagnosis agent for deciding whether the shortcut executed by the shortcut reasoning agent is to be adopted or not, a plurality of problem localizing units each including a storage for storing the problem localizing knowledge and the problem localizing agent, a first group of processors provided separately for operating the problem localizing units in parallel with one another, a plurality of shortcut reasoning units each including a storage for storing the heuristic knowledge and the shortcut reasoning agent, a second group or processors provided separately for operating the shortcut reasoning units in parallel, respectively, and a third processor provided separately from the first and second groups of processors for controlling the problem localizing unit and the shortcut reasoning unit with the above-mentioned meta level diagnosis agent.

In the fault diagnosis method based on the reasoning concept of the present invention, the knowledge related to the trouble shooting or fault diagnosis may be categorized into three levels mentioned below:

(a) a problem localizing knowledge for specifying or identifying a faulty component on the basis of the principle underlying the operation or function of an objective under diagnosis, (b) heuristic knowledge for localizing the faulty component on the basis of expertises of an expert in the fault diagnosis, and (c) meta level knowledge for determining a method of use of the problem localizing knowledge and the heuristic knowledge.

By virtue of this feature, preparation or description of a model for the diagnosis, i.e. an expert's problem solving model, can be facilitated while reducing labor required for preparation and maintenance of the knowledge base. By executing simultaneously in parallel the reasonings based on the three levels of knowledge mentioned above, overhead involved in the reasoning control which is increased as the high level knowledge increases can be reduced. Further, there can be implemented a fault diagnosis system which is capable of performing effectively the fault diagnosis with an improved or enhanced efficiency.

BRIEF DESCRIPTION OF THE DRAWINGS

FIG. 3 is a block diagram showing schematically a hardware structure of the fault diagnosis system;

FIGS. 4A to 4F are flow charts for illustrating basic operations of the fault diagnosis system;

FIG. 5 is a block diagram illustrating an example of problem localizing knowledge;

FIG. 7, FIGS. 8A and 8B, FIG. 9 and FIG. 10 are tables illustrating examples of data of an objective of interest, respectively.

DESCRIPTION OF THE PREFERRED EMBODIMENTS

The present invention will now be described in detail in conjunction with exemplary embodiments thereof by reference to the accompanying drawings.

Figure 1:
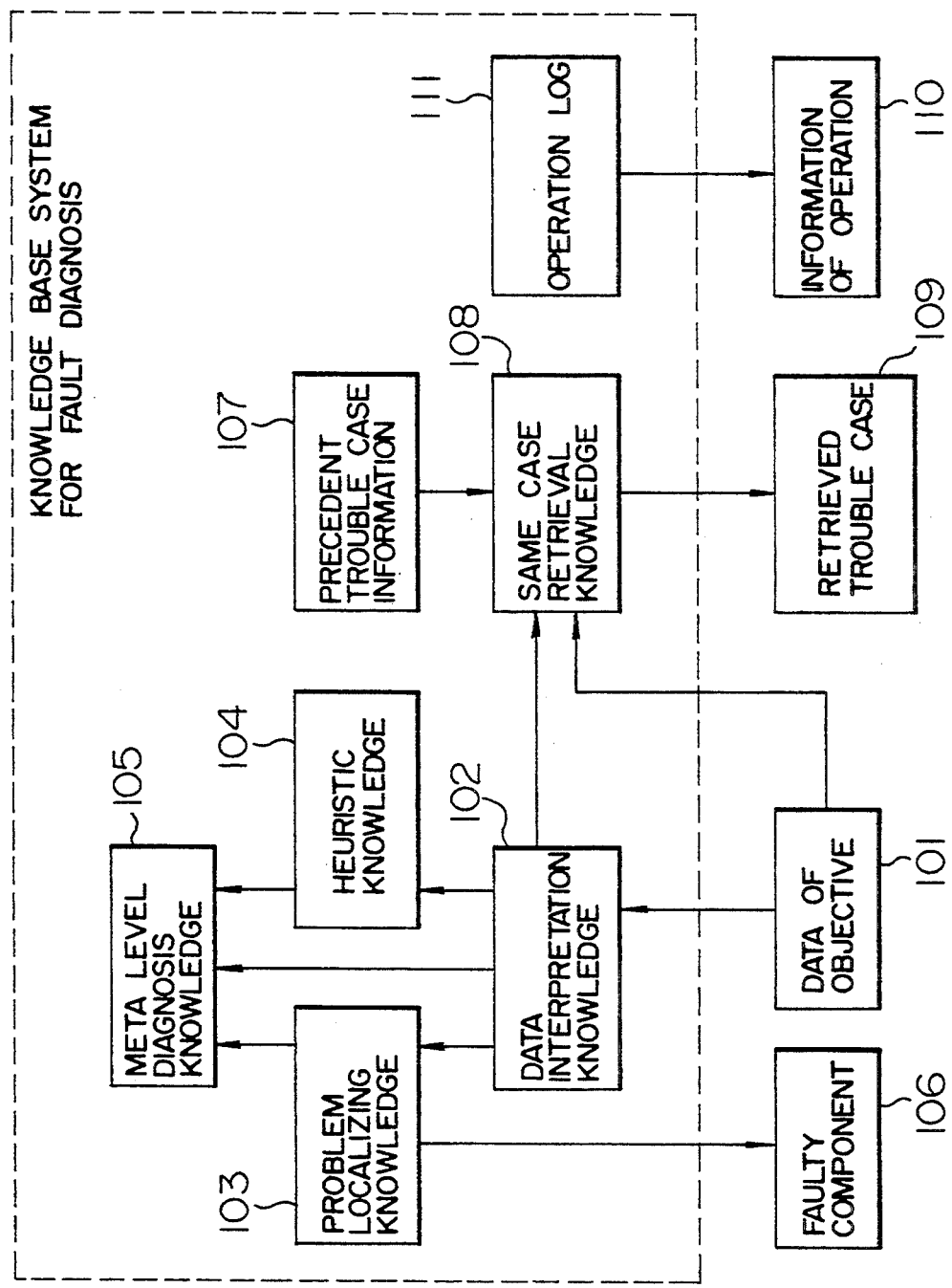
FIG. 1 is a block diagram showing a structure of a knowledge base for a fault diagnosis system according to an embodiment of the invention.

FIG. 1 illustrates in a schematic block diagram, a general arrangement of a knowledge base system for a fault diagnosis to be used in exemplary embodiments which incarnate the reasoning concept of the present invention. In the figure, the knowledge base system for the fault diagnosis is provided with a plurality of knowledge items 102 to 105, 107, 108 and 111. More specifically, the illustrated knowledge base includes a data interpretation knowledge item 102 for interpreting data (file) 101 of an objective to be diagnosed such as memory dump data of a computer system which are fetched to undergo the fault diagnosis, a basic knowledge item for localizing a problem (hereinafter referred to as the problem localizing knowledge item) 103 for localizing a problem of faulty component, a heuristic knowledge item 104 for use in inferring or reasoning a shortcut, a meta level diagnosis knowledge item 105 for use in controlling a fault diagnosis (or trouble shooting) process, a same case retrieval knowledge item 108 for use in retrieving a same precedent trouble case 109 from precedent trouble case information 107 and an operation log record 111 for holding the log 110 of diagnosis. The illustrated embodiment of the invention is characterized by the problem localizing knowledge item 103, the heuristic knowledge item 104 and the meta-level diagnosis knowledge item 105. Parenthetically, arrows shown in FIG. 1 indicate flows of data.

Figure 2:
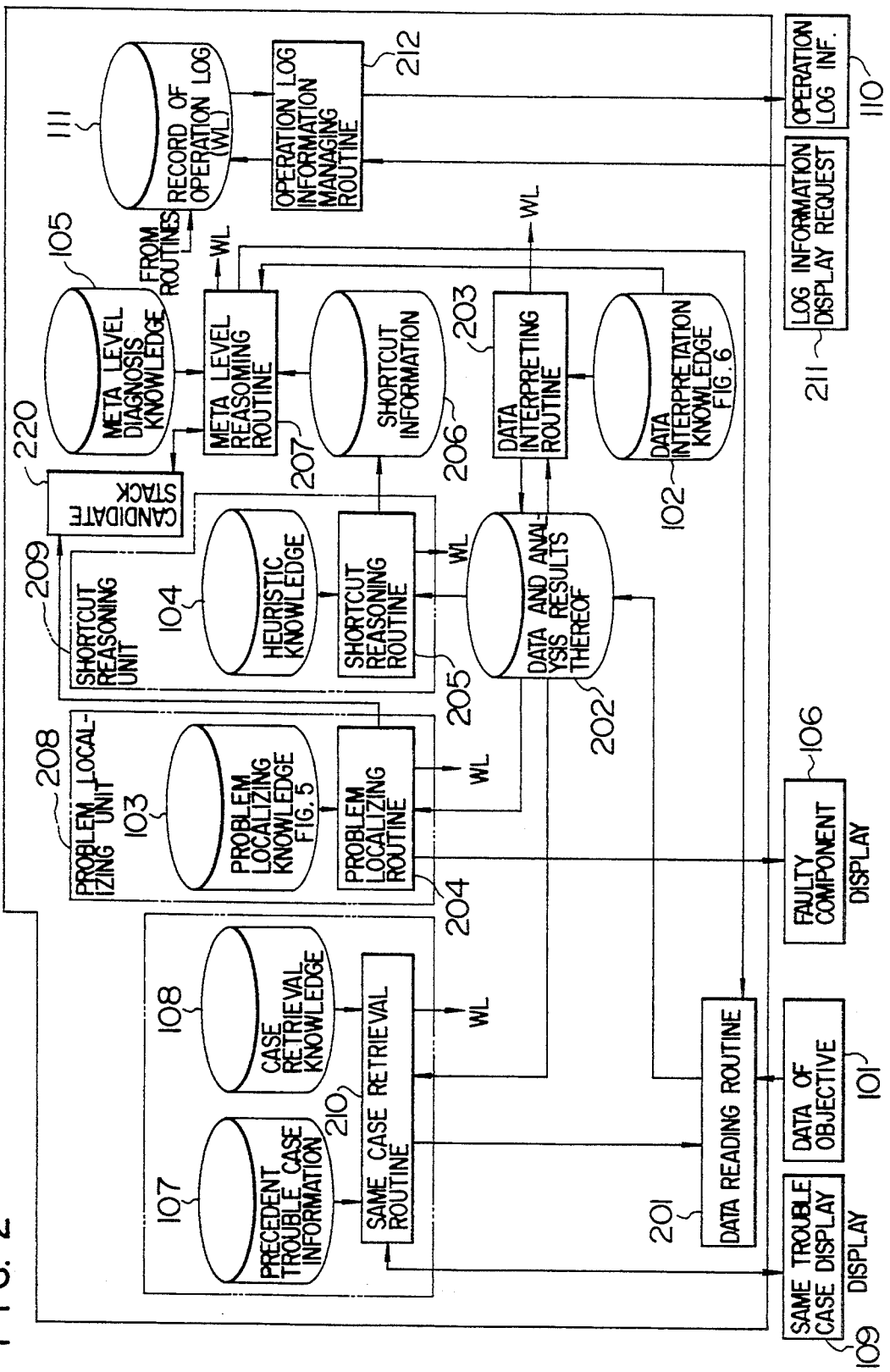
FIG. 2 is a functional block diagram showing a general arrangement of the fault diagnosis system.

FIG. 2 is a functional block diagrams showing generally a structure of a fault diagnosis system according to an embodiment of the invention which incorporates the knowledge base shown in FIG. 1. In FIG. 2, same components as those shown in FIG. 1 are denoted by like reference numerals. As will be seen from FIG. 2, the illustrated fault diagnosis system comprises a plurality of program modules (routine execution portions) 201, 203 to 205, 207, 210 and 212, a plurality of storages storing knowledge (iems) 102 to 105, 107, 108, 111, 202 and 206 and a candidate stack 220. The plurality of program modules are executed by one or more processors for achieving the goals. These program modules or routines include a data reading routine 201 for reading or fetching the data 101 and serving as a dump analysis tool, a data interpretation routine 203 for interpreting the data of interest, a problem localizing routine 204 for localizing faulty components, a shortcut reasoning routine 205 for inferring a shortcut and a meta level reasoning routine 207 for controlling the fault diagnosis method. On the other hand, the storages include a first file 102 for storing the data interpretation knowledge, a second file 202 for storing the data and the results of interpretation, a third file 103 for storing the problem localizing knowledge, a fourth file 104 for storing the heuristic knowledge, a fifth file 206 for storing the shortcut information resulting from the reasoning, a sixth file 105 for storing meta-level diagnosis knowledge, a seventh file 107 for storing information of the precedent trouble cases, an eighth file 108 for storing the case retrieval knowledge and a ninth file 111 for storing the record of diagnosis operation log. These files may be realized by independent external memories, respectively, or alternatively one and the same external memory may be used, being divided for the above-mentioned files correspondingly.

A problem localizing unit 208 is composed of the problem localizing routine 204 and the third file 103 for storing the problem localizing knowledge, while a shortcut reasoning unit 209 is constituted by the shortcut reasoning routine 205 and the fourth file 104 for storing the heuristic knowledge. These units 208 and 209 may be provided in desired numbers, respectively, and implemented separately by respective processors. Arrows shown in FIG. 2 indicate flows of data, as in the case of FIG. 1.

In the fault diagnosis system shown in FIG. 2, the names of the components subjected to the fault analysis are discriminatively recognized or identified by the problem localizing routine 204 by using the problem localizing knowledge 103, whereon the names thus determined are pushed down into the candidate stack 220 which is made use in association with the meta-level diagnosis knowledge 105. The candidate stack 220 serves for managing the sequence or order in which the data of interest are analyzed.

Now, description will be turned to a data analyzing method. A meta level reasoning routine 207 provides the name of the component or candidate for analysis from the candidate stack 220, checks the data corresponding to the name of the component provided from the stack 220, as described hereinafter by reference to FIG. 6, and transfers the name data to the data reading routine 201, through which the data 101 associated with the name is read out from the data file 101 to be subsequently written in the second file 202. The data is then analyzed by the data interpretation routine 203 with the aid of the data interpretation knowledge 102, the result of the interpretation being transferred to the problem localizing routine 204, while information indicating success or failure of the analysis is stored in the second file 202. The data interpretation routine 203 is designed to output the result of analysis after having translated it to the name of the component inferred as suffering from fault or trouble. Upon reception of the result of analysis, the problem localizing unit 208 which is composed of the problem localizing knowledge file 103 and the problem localizing routine 204 infers or identify the component to be next analyzed and pushes down the result of the inference into the candidate stack 220. By repeating the procedure described above, the faulty component 106 can stepwise be localized in a convergent fashion.

The shortcut reasoning routine 205 fetches the data of interest and the result of interpretation thereof from the second file 202 and determines through reasoning the appropriate or relevant one of the shortcuts on the basis of the heuristic knowledge prepared previously in the heuristic knowledge file 104, the result of the reasoning being stored in the fifth file 206 adapted to stoke the shortcut information. Subsequently, the meta-level reasoning routine 207 fetches the shortcut information from the fifth file 206 to thereby determine whether the shortcut is to be executed or not. When execution of the shortcut is decided, the name of the relevant component to be subjected to the fault diagnosis through the shortcut reasoning is pushed down onto the candidate stack 220, whereupon the meta level reasoning routine 207 provides the name of the component to undergo the fault diagnosis or fault analysis from the candidate stack 220, which name is then transferred to the data reading routine 201. The succeeding processing is performed similarly to the data analysis described previously. In this manner, in the case of the illustrated embodiment of the invention, the meta level reasoning routine 207 is adapted to take out the starting candidate from the candidate stack 220 for the analysis.

The case retrieval routine 210 reads out the data of interest and the result of interpretation thereof from the second file 202 and retrieves a same precedent trouble case 109 from the past or precedent trouble case information 107 with the aid of the case retrieval knowledge 108. In that case, the data 101 may be read out through the medium of the data reading routine 201, if necessary. Then, an operation log information display routine 212 reads out information from the operation log file 111 in response to the input of a log information display request by the user.

FIG. 3 is a schematic block diagram showing, by way of example only, a hardware structure of the fault diagnosis system shown in FIG. 2. Referring to FIG. 3, the illustrated fault diagnosis system includes a first CPU (Central Processing Unit) 301 for executing the previously mentioned routines 201, 203, 207, 210 and 212, a second CPU 309 for executing the problem localizing routine 204, a third CPU 311 for executing the shortcut reasoning routine 205, an input unit 313, a display device 314, a first storage 302 (corresponding to the first file 102) for storing the data interpretation knowledge, a second storage 303 (corresponding to the second file 202) for storing the data of concern along with the result of interpretation thereof, a third storage 304 (corresponding to the fifth file 206) for storing the shortcut information, a fourth storage 305 (corresponding to the sixth file 105) for storing the meta level diagnosis knowledge, a fifth storage 306 (corresponding to the seventh file 107) for storing the precedent (past) trouble cases, a sixth storage 307 (corresponding to the eighth file 108) for storing the same precedent case retrieval knowledge, a seventh storage 308 (corresponding to the ninth file 111) for storing the operation log information, an eighth storage 310 (corresponding to the third file 103) for storing the problem localizing knowledge, a ninth storage 312 (corresponding to the fourth file 104) for storing the heuristic knowledge, and a tenth storage (corresponding to the data file 101) for storing the data 101 for the fault diagnosis.

FIGS. 4A to 4F are flow charts for illustrating operations of the fault diagnosis system according to the instant embodiment of the invention. In the following description of the fault diagnosis method according to the invention, it is assumed, by way of example only, that fault or trouble in software for a large scale computer system is to be diagnosed and that the data to be diagnosed in respect to the faulty component(s) is that of a memory dump outputted by the computer upon occurrence of failure or trouble. Parenthetically, that which is referred to as the memory dump is the data which represents the internal states of the computer.

FIG. 5 shows an example of the problem localizing knowledge 103 employed in carrying out the fault diagnosis according to the instant embodiment of the invention. The component or part of software programs which suffers from a fault is convergently localized in a stepwise fashion more and more closely in the direction indicated by arrows. More specifically, with the problem localizing knowledge illustrated in FIG. 5, it is first determined whether the computer is in the state in which "job can not be canceled" 501. Subsequently, it is analyzed whether the computer is in the state where "task is not executable" 502 or "space is not executable" 503 or "action is not executable" 504. When the diagnosis proceeds in this manner up to the end states indicated by broken line blocks in FIG. 5 and when the phenomenon of fault could have been confirmed, then it can be said that the faulty component has been identified.

Figure 6:
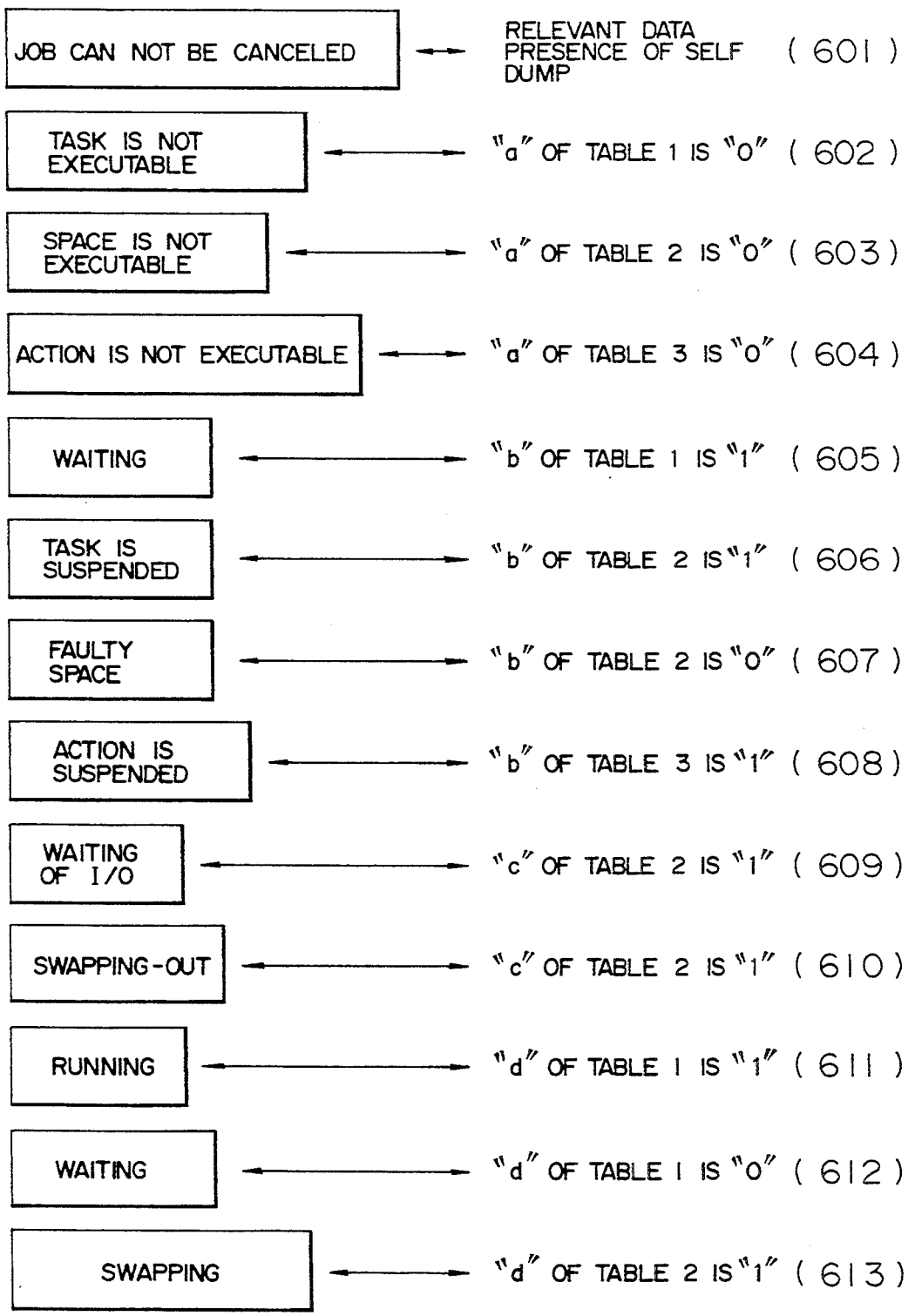
FIG. 6 is a chart for illustrating an example of data interpretation knowledge.

FIG. 6 shows an example of the data to be processed in the system according to the illustrative embodiment of the invention. In this figure, intra-labeled blocks shown at the left-hand side represent correspondingly the faulty components indicated by the respective labels, as in the case of FIG. 5. On the other hand, there are shown at the right-hand side in FIG. 6 the data and values thereof to be processed for confirming the corresponding faulty components, as indicated by double-head arrows, respectively. By way of example, one of the data interpretation knowledges denoted by 602 means that the faulty state or component of the computer software indicated by the label "task is not executable" is confirmed when the value of a column a of a table 1 of the memory dump is "0" (zero).

In this conjunction, an example of the data of interest is illustrated in FIG. 7.

Now, a first exemplary embodiment of the fault diagnosis according to the invention will be described by reference to the flow charts shown in FIGS. 4A and 4B which illustrate, by way of example, a procedure for identifying as a faulty component an input/output (I/O) part of computer software by confirming that the I/O part is "running" (511, FIG. 5) on the basis of the data shown in FIG. 7 with the aid of the problem localizing knowledge.

Figure 4B:
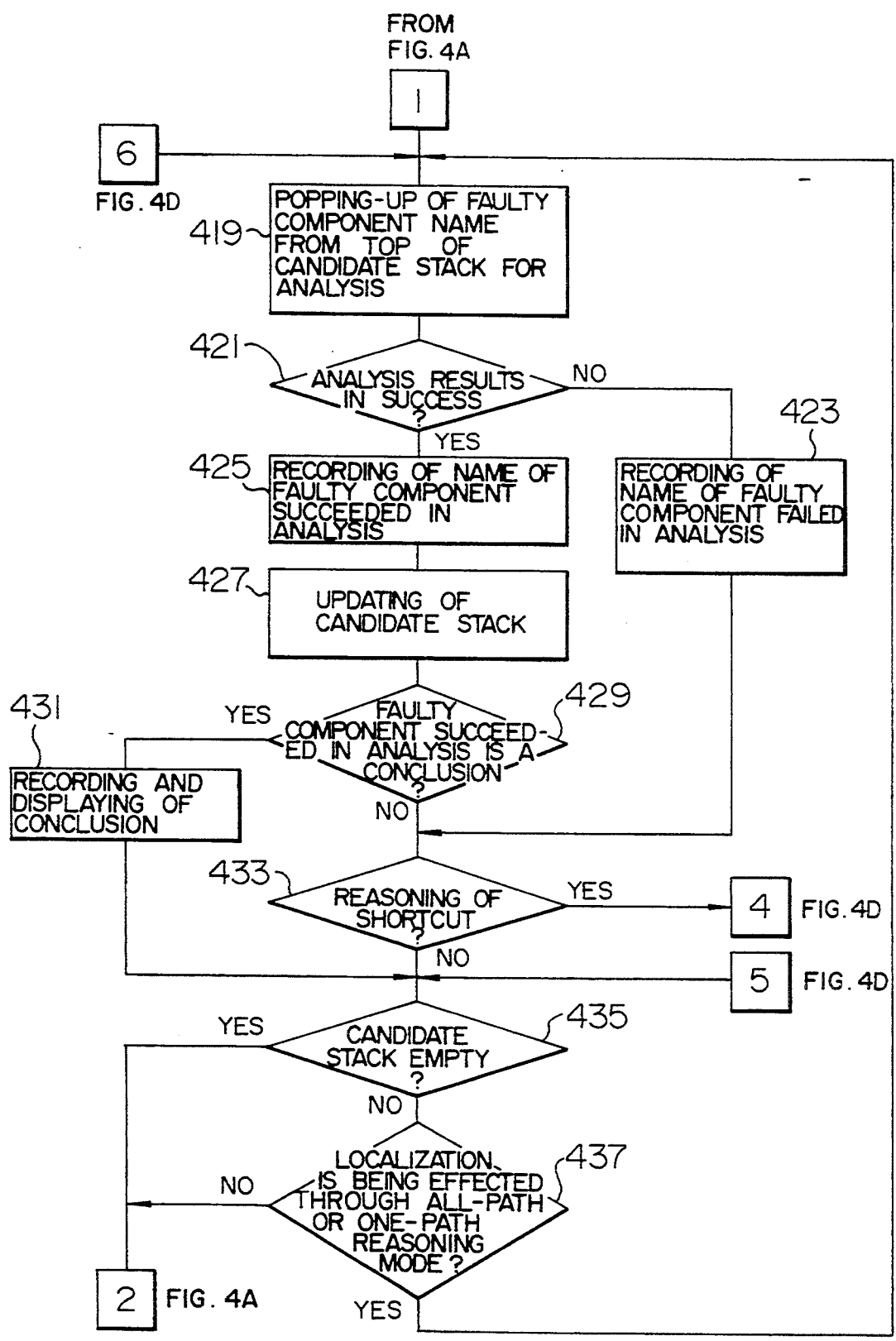
Figure 4D:
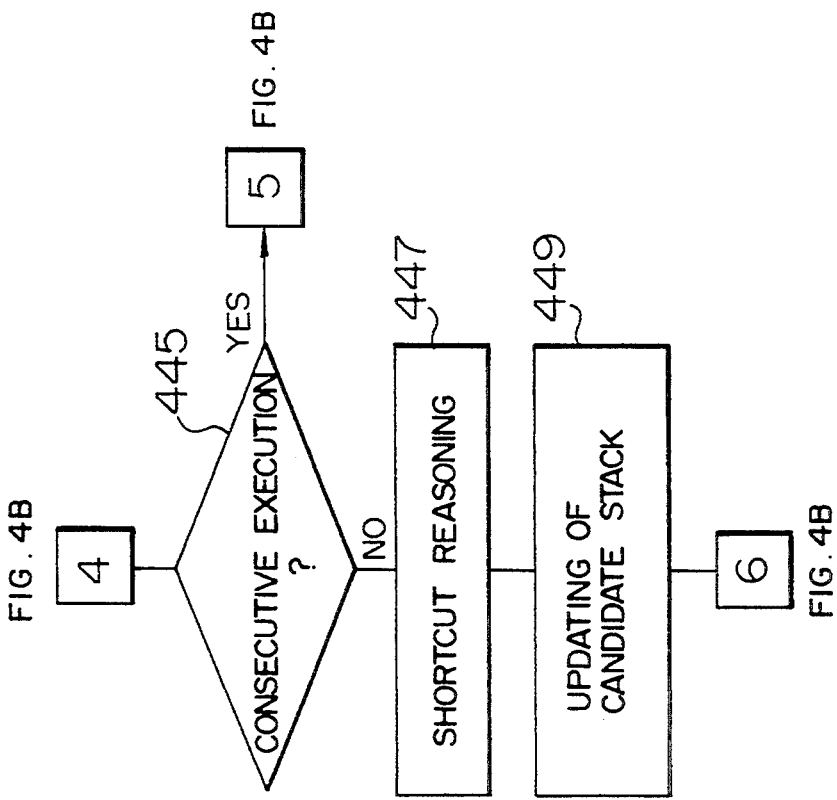
Figure 4C:
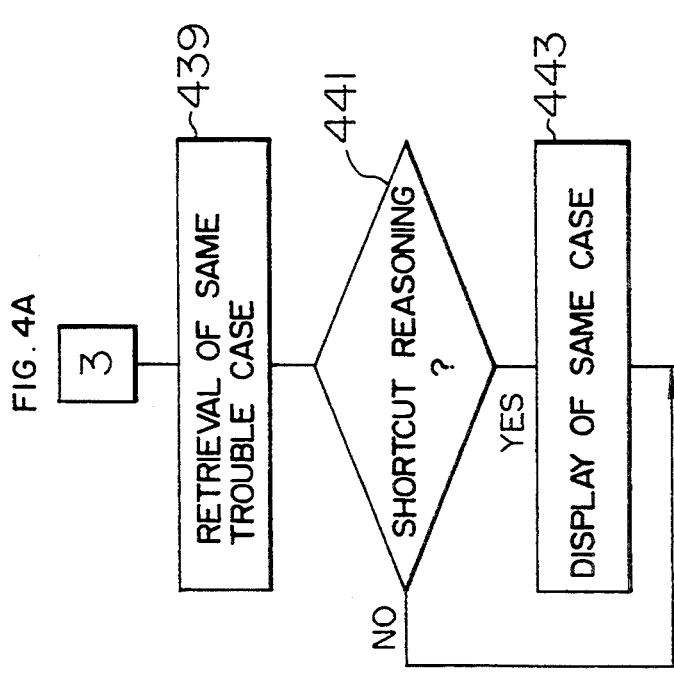

Referring to FIGS. 4A and 4B, in succession to the start (START) of the processing, an end processing step 401 and/or the same case retrieval step 403 may be selected. It is however assumed here that neither the end step nor the same precedent case retrieval step is executed but the processing proceeds to a step 407 where the meta level diagnosis knowledge is set up. The meta level diagnosis knowledge is used for controlling the fault diagnosis process. With this meta level diagnosis knowledge, it is possible to validate selectively any one of the following processes:

(1) selection of the reasoning modes,
(2) execution of the shortcut process and the conditions therefor,
(3) parallel execution of the reasonings, or
(4) execution of an assumption-based reasoning and the conditions therefor.

Description will first be made on the assumption that the selection of reasoning (1) is validated. By validating the selection of reasoning modes, it is possible to select one of three modes "stepwise execution", "one-path execution" and "all-path execution".

As a location or faulty component from which the analysis is to be started, the component identified by the label "job can not be canceled" 501 is set up (step 409).

The name of the component as set up is pushed down onto the candidate stack.

Next, selection of the reasoning modes is performed (step 411). As the reasoning modes, there can be mentioned "stepwise execution" mode in which the processing is interrupted every time a single diagnosis step (or process) is completed, "one-path execution" mode in which the processing is interrupted every time one faulty component or location is identified, and "all-path execution" mode in which the processing is terminated when all the faulty locations or components have been identified. It is assumed here that the "stepwise execution" mode is selected.

In succession to the selection of the stepwise execution mode at the step 413, a faulty component to be analyzed is selected at a step 415, whereon the name of the faulty component as selected is pushed down onto the leading end or top of the candidate stack (step 417). Because the name of the faulty component selected is "job can not be canceled", this name is placed at the start of the candidate stack.

At a next step 419, the faulty component name placed at the start of the stack is provided and the data of interest is analyzed in accordance with the data analysis method described hereinbefore. The problem "job can not be canceled" can be identified by checking the presence of the self memory dump, as will be seen from the data interpretation knowledge 601 shown in FIG. 6. In this conjunction, it is assumed that the presence of the self memory dump has been confirmed through the data reading routine. Since this means that the analysis has been performed successfully (step 421), the name of the faulty component for which the analysis results in success is stored in the second file 202 together with the associated data and the result of the analysis (step 425).

Subsequently, the problem or faulty component to be next analyzed is determined with the aid of the problem localizing knowledge. In the case of the example illustrated in FIG. 5, the faulty component to be localized in succession to the problem "job can not be canceled" are "task is not executable", "space is not executable" and "action is not executable". Accordingly, the names of these three components are pushed down onto the candidate stack, the contents of which are then updated (step 427). Since the faulty component name "job can not be canceled" has already been popped up, the contents of the candidate stack will now be ["task is not executable", "space is not executable" "action is not executable"] arrayed in this order from the start of the stack.

Since the faulty component "job can not be canceled" is not the goal (step 429), meaning that the candidate stack is not empty (step 435) and since the selected reasoning mode is the stepwise reasoning mode (step 437), the step 401 is resumed. The process described above constitutes one diagnosis step or process. In the case of the instant embodiment, shortcut reasoning (step 433) is not validated.

At the next diagnosis step, the faulty component "task is not executable" is selected as the trouble to be analyzed from the candidate stack ["task is not executable", "space is not executable", "action is not executable"] (step 415). As will be seen from the data interpretation knowledge 602 illustrated in FIG. 6, the faulty component "task is not executable" can be confirmed by checking the column a of the table 1. Through the data reading routine, it is confirmed that the column a of the table 1 shown in FIG. 7 has a value of "0" (step 419).

Thus, the analysis results in success (step 421). Accordingly, the faulty component "task is not executable" is stored in the second file 202 mentioned hereinbefore (step 425), being then followed by determination of the faulty component to be next analyzed with the aid of the problem localizing knowledge.

In the case of the example shown in FIG. 5, the components to be localized in succession to the one "task is not executable" are "waiting" and "swapping out". Accordingly, the names of these two are pushed down onto the candidate stack, the content of which is then updated (step 427). Since the faulty component "task is not executable" has already been provided, the content of the candidate stack is of |"waiting", "space is not executable", "action is not executable"| arrayed in this order from the start of the candidate stack. Since the faulty component "task is not executable" is not a conclusion (step 429), meaning that the candidate stack is not empty (step 435) and since the reasoning mode is the stepwise execution mode (step 437), the step 401 is regained.

At the next diagnosis step, the reasoning mode is set to the one-path execution (step 411). Since the mode is not the stepwise execution mode (step 413), selection of the faulty component to be analyzed is not validated but the state "waiting" is popped up from the top of the candidate stack of ["waiting", "swapping out", "space is not executable", "action is not executable"] to be subsequently analyzed (step 413). As will be seen from the data interpretation knowledge 605 shown in FIG. 6, the state "waiting" can be confirmed by checking the column b of the table 1 shown in FIG. 7. When it is confirmed that the column b of the table 1 of FIG. 7 has a value of "1" this means that the analysis results in success (step 419). Since the analysis has ended in success (step 421), the component "waiting" is stored in the second file 202 mentioned hereinbefore (step 425), whereon the component to be next analyzed is determined with the aid of the problem localizing knowledge.

Since the component to be localized in succession to the one "waiting" is "waiting of I/O" in the case of the example illustrated in FIG. 5, the latter is pushed down onto the candidate stack at a step 427 to update the content thereof, which is now in the order of ["waiting of I/O", "swapping out", "space is not executable", "action is not executable"] as viewed from the start. Since "waiting" is not conclusion (step 429), meaning that the candidate stack is not empty (step 435), and since the reasoning mode is the one-path execution mode (step 437), return is made to the step 419.

At the next diagnosis step, "waiting of I/O" is provided from the top of the candidate stack which is of the content ["waiting of I/O", "swapping out", "space is not executable", "action is not executable"] and analyzed subsequently (step 429). As will be seen from the data interpretation knowledge 601 shown in FIG. 6, "waiting of I/O" can be confirmed by checking the value of the column c of the table 1 shown in FIG. 7. When it is confirmed through the data reading routine that the column c of the table 1 shown in FIG. 7 has a value of "1", this means that the analysis is successful (step 421). Accordingly, the component "waiting of I/O" is stored in the second file 202 mentioned hereinbefore (step 425), whereon the component to be next analyzed is determined with the aid of the problem localizing knowledge.

In the case of the example illustrated in FIG. 5, the problematic components to be localized in succession to "waiting of I/O" are "running" and "waiting state". Accordingly, these two are pushed down onto the candidate stack 220 to update the content thereof (step 427), which is now in the order of ["running", "waiting state", "swapping out", space is not executable", "action is not executable"], as viewed from the top of the stack. Since "waiting of I/O" is not conclusion (step 429), meaning that the candidate stack is not empty (step 435), and since the reasoning mode is the one-path execution (step 437), return is made to the step 419.

At the next diagnosis step, the component "running" provided up from the top of the candidate stack of ["running", "waiting state", "swapping out", "space is not executable", "action is not executable"] for the subsequent analysis. As will be seen from the data interpretation knowledge 611 shown in FIG. 6, the problematic component "running" can be confirmed by checking the value of column d of the table 1 shown in FIG. 7. When it is confirmed through the data reading routine that the column d of the table 1 shown in FIG. 7 has a value of "1" this means that the analysis is successful (step 421). Accordingly, "running" is stored in the second file 202 mentioned hereinbefore (step 425), whereon the component to be next analyzed is determined with the aid of the problem localizing knowledge.

In the case of the example illustrated in FIG. 5, "running" is a conclusion, indicating that the problematic component to be next localized is no longer present. Consequently, nothing is newly pushed down onto the candidate stack, whose content is thus in the order ["waiting state", "swapping out", space is not executable", " action is not executable"]. Since "running" has proved to be a conclusion (step 429), this data is stored in the second file 202 and displayed at a step 431. Because the candidate stack is not empty (step 435) with conclusion being obtained in the one-path execution mode (step 437), the step 401 is regained. Through the five diagnosis steps (or processes) described above, one faulty component "running" can be specified.

At this time point, termination or end of the diagnosis can be selected. However, it is assumed that the remaining components are analyzed in consideration of the possibility of presence of further faults. To this end, the reasoning is set to the all-path execution mode (step 411). Being different from the stepwise execution mode (step 413), no selection of the components for analysis is effected, but "waiting state" is popped up from the top of the candidate stack having the content ["waiting state", "swapping out", "space is not executable", "action is not executable"] for the purpose of analysis. As will be seen from the data interpretation knowledge 612 shown in FIG. 6, "waiting state" can be confirmed by checking the column d of the table 1 shown in FIG. 7. In this case, it is confirmed through the data reading routine that the column d of the table 1 of FIG. 7 has a value of "1", which means that the analysis has resulted in failure (step 419). Because of failure in the analysis (step 421), "waiting state" is stored in the second file (step 423). Since the candidate stack is not empty (step 435) with the reasoning set to the all-path execution mode (step 437), the step 419 is regained. Through similar procedure, problematic components "swapping out", "space is not executable" and "action is not executable" are subjected to the analysis, which are all ended in failure. At the point in time when the candidate stack becomes empty (step 435), the step 401 is regained, whereon the end is selected to terminate the diagnosis processing.

The embodiment of the invention described above is advantageous in that description of the problem localizing knowledge is much facilitated for the expert by virtue of the feature that the data of interest is analyzed with the aid of the data interpretation knowledge, while the user can easily understand the result of the analysis. Besides, the stepwise execution mode taught by the invention allows the user to select the problematic component to be analyzed as he or she desires. Further, owing to the one-path execution mode, the diagnosis can be continued until a conclusion is reached. Additionally, the all-path execution mode makes it possible to continue the diagnosis until all the locations where possibility of fault exists have been analyzed. Finally, the fault diagnosis system according to the embodiment described above may be utilized as a learning back-up system in teaching the fault diagnosis method to novices by displaying to them the names of the locations for which the diagnosis results in failure (step 423) as well as the names of the locations for which the diagnosis has been performed successfully together with the data undergone the analysis.

Next, as a second embodiment of the fault diagnosis according to the invention, description will be made by reference to FIGS. 4A to 4D as to how a problematic component or location can be identified on the basis of the data illustrated in FIGS. 8A and 8B through the shortcut process with the aid of the problem localizing knowledge together with the heuristic knowledge.

The instant embodiment of the invention now under consideration is concerned with (2) execution of the shortcut and the conditions therefor mentioned hereinbefore in connection with the meta level reasoning knowledge validation methods (1) to (4), of which the method (1) has already been described in conjunction with the first embodiment of the invention. The meta level knowledge validation methods (3) and (4) will be elucidated hereinafter in conjunction with further embodiments of the invention. In any case, the same table information as that illustrated in FIG. 7 is utilized on the assumption that the faulty or problematic component is "running" as in the case of the first embodiment.

The heuristic knowledge is expressed in terms of a reference part referred to upon making a decision as to the possibility of execution of the shortcut and an execution part describing the name of the problematic component or location to be analyzed after execution of the shortcut. The heuristic knowledge is stored in the fourth file 104, as mentioned hereinbefore. The reference part includes an analysis-success field in which the data analyzed successfully or the result thereof is described and an analysis-failure field in which the data failed in analysis is contained. In the case of the instant embodiment, it is assumed that the analysis-success field of the reference part contains components "job can not be canceled", "task is not executable", "program name is salary calculation" and "hardware name is M-666", while the execution field contains the heuristic knowledge of the component "running".

The condition for execution of the shortcut is assumed to be given in terms of the ratio of the number of the components whose fault can be confirmed from the data to the total number of the components "job can not be canceled", "task is not executable", "program name is salary calculation" and "hardware name is M-666".

More specifically, when the value resulting from division of the number of the components whose fault has been confirmed by 4, which represents the total number of the components contained in the reference part, exceeds 75%, the shortcut reasoning of the component "running" is validated for the analysis. Parenthetically, description of the condition for execution of the shortcut is handled as the meta level diagnosis knowledge and stored in the fifth file 105 mentioned hereinbefore.

Upon start of the diagnosis operation, the name of a program running on a computer system to be diagnosed and the name of hardware are inputted to the second file 202 destined to store the data to be analyzed and the result of analysis. Subsequently, "job can not be canceled" 501 is selected as the component from which the analysis is to be started (step 409), and the reasoning mode is set to the one-path execution mode. Differing from the reasoning of the stepwise execution mode, the component "job can not be canceled" is provided from the candidate stack for analysis by skipping the step for selection of the component to be analyzed. Through the procedure similar to that described previously in conjunction with the first embodiment, the analysis has been conducted successfully (step 421), whereby "job can not be canceled" is stored in the second file 202 (step 425), as a result of which the content of the candidate stack is updated to ["task is not executable", "space is not executable", "action is not executable"] (step 427). Since the fault analyzed successfully represents no conclusion (step 429), the shortcut is inferred (step 433).

Since the shortcut is not the reasoning executable consecutively (step 445), the shortcut is inferred at a step 447. At this time point, the second file dedicated for the storage of the data and the result of analysis contains ["job can not be canceled", "program name is salary calculation", "hardware name is M-666"], which means that the conditional value of 75% defined previously for the shortcut is satisfied. Consequently, for execution of the shortcut, "running" is pushed into the candidate stack at the start thereof (step 449), whereon the step 419 is resumed.

At a next diagnosis step, "running" placed at the top of the candidate stack of ["running", "task is not executable", "space is not executable", "action is not executable"] is provided to be analyzed. Through the similar procedure as with the case of the first embodiment, the analysis ends in success (step 421). Accordingly, the result of the analysis is recorded as the conclusion and displayed (step 431). At that time, since the candidate stack is not empty and since the reasoning is of the one-path execution mode, the step 401 is regained.

As will be understood from the foregoing, diagnosis performed by using the heuristic knowledge allows the faulty component or location to be identified with a smaller number of the diagnosis steps when compared with the diagnosis conducted by using only the problem localizing knowledge. Further, since the problem localizing knowledge and the heuristic knowledge are separately described, preparation and maintenance of these knowledges are facilitated correspondingly. Further, since the heuristic knowledge is described in terms of the meta level diagnosis knowledge, trial and adjustment of the conditions for execution of the diagnosis based on the heuristic knowledge are facilitated, Now, referring to the flow charts shown in FIGS. 4A to 4D, a third embodiment of the invention will be described, which embodiment is directed to a method of identifying a faulty component by executing in parallel the diagnosis based on the problem localizing knowledge and the diagnosis based on the heuristic knowledge for the data shown in FIGS. 8A and 8B. The parallel execution is validated with the aid of the meta level reasoning knowledge. In other words, the instant embodiment of the invention is concerned with "(3) parallel execution of reasonong" mentioned hereinbefore in conjunction with the meta level reasoning knowledge validation methods (1) to (4). The table information is assumed to be the same as that shown in FIG. 7. The heuristic knowledge and the condition for execution of the shortcut can be validated only in the one-path execution mode or the all-path execution mode.

According to the instant embodiment, the shortcut reasoning (steps 447, 449) from which the step 445 for inhibiting the consecutive execution has been removed and the reasoning by using the problem localizing knowledge (FIG. 4B) are executed in parallel by separate CPUs, respectively. More specifically, the problem localizing routine for realizing the reasoning based on the problem localizing knowledge is executed by the second CPU 309, while the shortcut reasoning routine is executed by the third CPU 311.

In the shortcut reasoning, step 447 and 449 are executed repetitively until one conclusion has been obtained, whereon the name of the shortcut component as inferred is pushed down onto the candidate stack. On the other hand, the meta level reasoning routine intercepts the reasoning based on the problem localizing knowledge, when the executable shortcut is pushed down onto the candidate stack, for analyzing the name of the component pushed down.

In the diagnosis operation, the name of the program having run on a computer system to be diagnosed and the name of hardware are inputted to the second file 202 dedicated to storage of the data of interest and the result of analysis thereof. Subsequently, diagnosis is performed in a similar manner as described hereinbefore in connection with the second embodiment to infer the shortcut. The reasoning based on the problem localizing knowledge is executed in parallel until the component "running" to be analyzed by the shortcut reasoning is pushed down onto the candidate stack at the top thereof (step 449).

As will be understood from the above description, by executing the shortcut reasoning based on the heuristic knowledge and the reasoning based on the problem localizing knowledge in parallel by separate CPUs, respectively, overhead of the reasoning or inference control can be reduced.

Figure 4E:
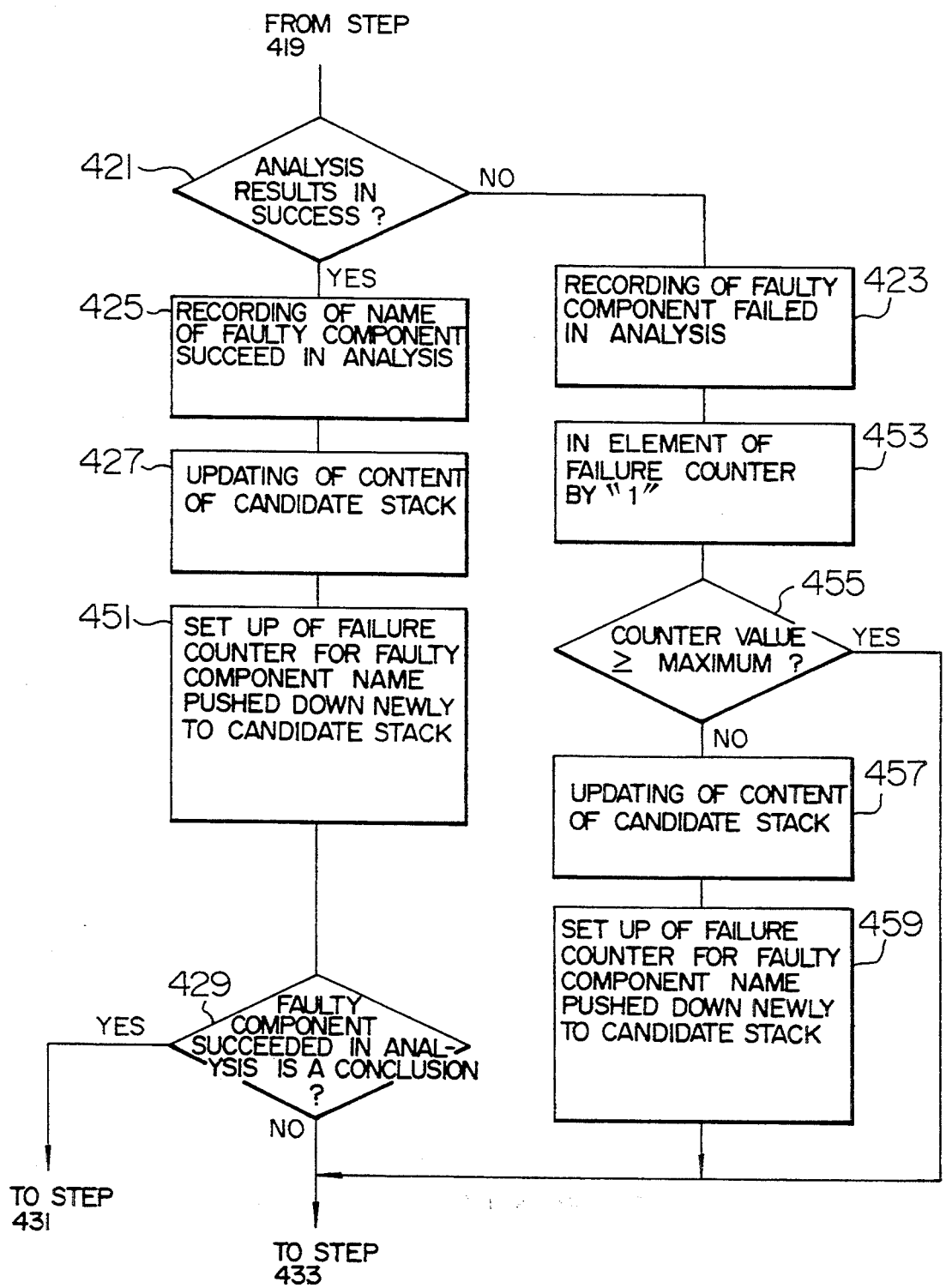

Next, referring to the flow charts shown in FIGS. 4A, 4B and 4E, a fourth embodiment of the invention will be described which is directed to a method of identifying a faulty component or location through the assumption-based reasoning for the data shown in FIG. 9 with the aid of the problem localizing knowledge. In the case of the fourth embodiment, the steps succeeding to the step 427 are modified in such a manner as shown in FIG. 4E.

The fourth embodiment is concerned with execution of the assumption-based reasoning and the conditions therefor mentioned hereinbefore as the fourth meta level knowledge validation method. With the assumption-based reasoning, it is contemplated to mean a reasoning method in which even when data required for locating a faulty component can not be acquired, diagnosis is executed consecutively on the assumption that the data was available. The condition for execution of the assumption-based reasoning is set up by a failure counter which counts the number of times acquisition of the data required for the problem localization has failed. More concretely, in the case of the instant embodiment, the maximum number of the failure counter is set to "2" for thereby allowing the diagnosis to be continued for identifying the faulty component regardless of the presence of one location or component for which the data of interest is unavailable.

Initially, the failure counter is set to "0", whereon the problematic component "job can not be canceled" is analyzed through the similar procedure described hereinbefore in conjunction with the first embodiment (step 419). When the anaylysis results in success (step 421), the name of the component is recorded (step 425). Thereafter, the content of the candidate stack is updated at the step 427. In that case, the name of the component to be newly pushed down is affixed with a parenthesized value "N" of the failure counter to be expressed such that "task is not executable (N) ", whereon the value of the failure counter is incremented. Consequently, the content of the candidate stack is of ["task is not executable (0)", "space is not executable (0)", "action is not executable (0)"].

At the next diagnosis step, "waiting" is analyzed. In this case, however, it is observed that the value of the column b of the table 1 shown in FIG. 9 which is the data involved in the analysis of waiting" is indefinite. As a result, the analysis at a step 421 will end in failure. Accordingly, the failed analysis of "waiting" is recorded (step 423), which is followed by incrementation of the value of the failure counter by one (step 453), the content of the counter being now "WAIT (1)". However, since the counter value does not exceed "(2)" set as the maximum or limit value of the failure counter (step 455), "waiting of I/O" which is to be localized in succession to "waiting" is pushed down onto the candidate stack at the top thereof (step 457) and the value of the failure counter is incremented. As a result of this, the content of the candidate stack becomes ["I/O waiting (1)", "swapping out (0)", "space is not executable (0)", "action is not executable (0)"]. At the succeeding diagnosis step, the faulty component can be successfully identified, as in the case of the first embodiment.

As will now be understood, a faulty component can correctly be specified or identified even when a part of the data of interest is indeterminate, because the diagnosis is continued by assuming that the data actually unavailable for localizing a faulty component were present. Further, by adjusting the value of the failure counter, the condition for terminating the assumption-based reasoning can be set controllably.

Figure 4F:
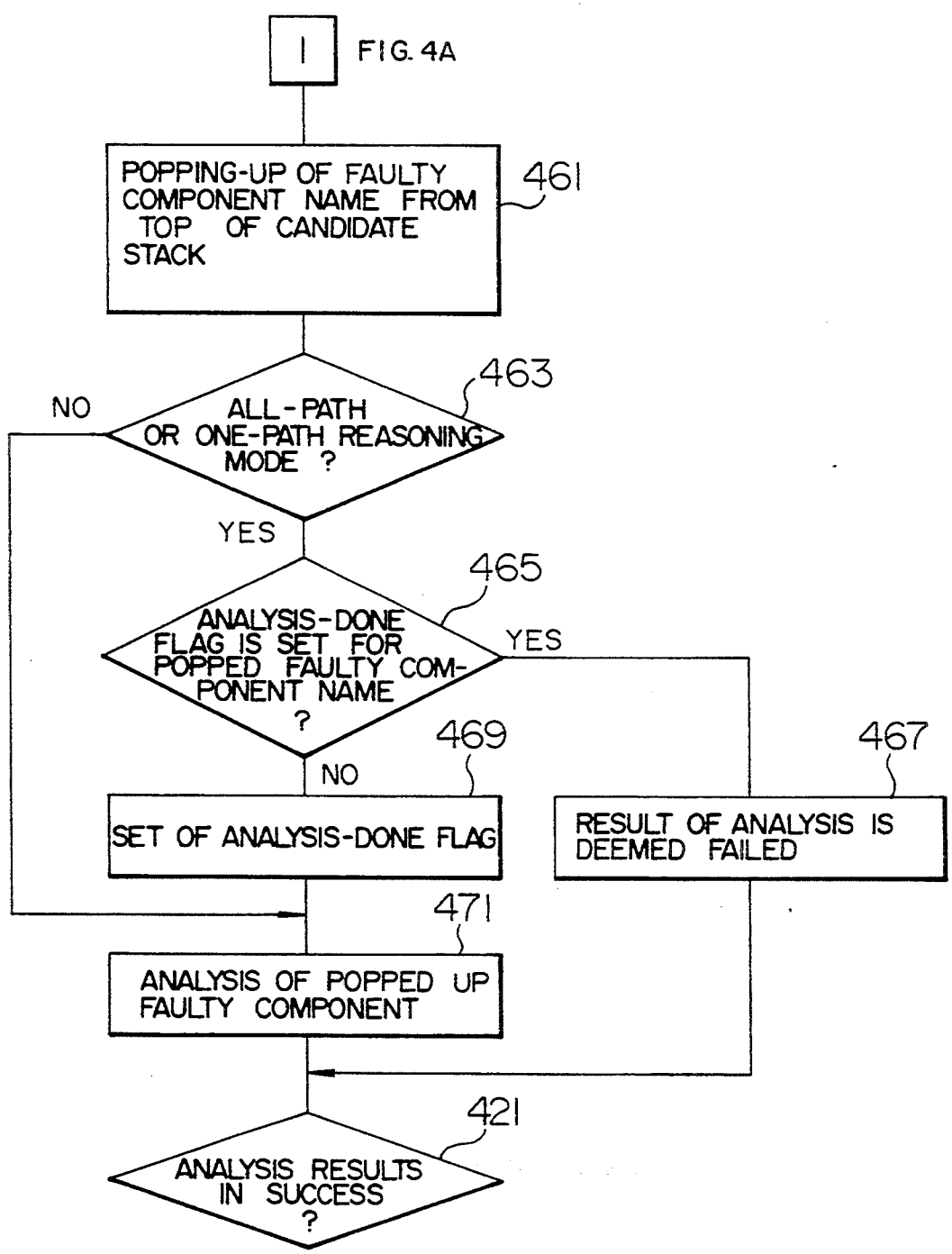

Next, referring to the flow charts shown in FIGS. 4A, 4B and 4F, description will be made of a fifth embodiment of the invention which is directed to a method of identifying a faulty component through the reasoning of the one-path execution mode or all-path execution mode on the basis of data shown in FIG. 10 by using the problem localizing knowledge, wherein control is performed so that a same component is not analyzed more than twice, inclusive. In the case of the fifth embodiment, the steps 419 to 421 are modified in a manner shown in FIG. 4F.

According to the teaching of the invention incarnated in the fifth embodiment, there is provided an analysis-done flag indicating that the analysis has already been performed in order to prevent double analyses from being conducted on a same component. The analysis-done flag is provided in correspondence to each of the faulty components and is set after the analysis for indicating that the analysis has been done. As the reasoning mode, the one-path execution mode is selected.

The procedure from the step 417 where "job can not be canceled" is pushed down onto the candidate stack to the step 461 where it is provided is the same as in the case of the first embodiment. Since the reasoning is of the one-path execution mode (step 463), it is checked at a step 465 whether or not the analysis-done flag is set for the fault whose identifier or name is popped up from the stack. Since it is assumed that no analysis-done flag has been set at this time point, "job can not be canceled" is analyzed, whereon the analysis-done flag is set (steps 469, 471). The diagnosis is continued through similar procedure. When "task is not executable" and "swapping out" have been analyzed successfully, "swapping" is outputted as the conclusion At this time, the analysis-done flags as set correspond to those for "job cannot be canceled", "task is not executable", "swapping out" and "swapping", respectively. The content of the candidate stack is of ["space is not executable", "action is not executable"].

The remaining faulty components are analyzed by performing once again the reasoning in the one-path execution mode. In this case, the analysis of "space is suspended" and "task is inhibited from execution" result in success. Thus, the content of the candidate stack is now ["swapping out", "faulty space", "action is not executable"]. Thus, "swapping out" is popped up (step 461), whereon it is checked whether or not the analysis-done flag corresponding to "swapping out" has been set (step 465). Since this flag has already been set, the analysis will result in failure. Accordingly, the analysis of "swapping out" is not performed. Subsequently, the analyses of "faulty space" and "action is not executable" are performed unsuccessfully. The candidate stack becomes empty at a step 435, and the step 401 is regained.

In this manner, provision of the analysis-done flag makes it possible to prevent double analyses from being performed on a same component, while unfruitful analysis execution can be omitted. Further, any loop possibly existing in the problem localizing knowledge can be evaded to thereby protect the execution of diagnosis against falling in an endless loop.

Next referring to the flow charts shown in FIGS. 4A to 4D, description will be made of a sixth embodiment of the invention which is directed to a method of inferring a same trouble case 109 as that retrieved from the precedent trouble case information 107 through a case retrieval routine 210 after a problematic component has been identified with the aid of the problem localizing knowledge for the data shown in FIG. 7.

The case retrieval knowledge is expressed in terms of a conditional part containing an identified faulty component and the data of interest and a conclusion part containing a precedent trouble case identification number. More specifically, in the case of the sixth embodiment of the invention, the case retrieval knowledge includes the conditional part setting forth that the faulty component is "running" and the column d of the table 3 is "1" and the conclusion part containing the precedent trouble case identification number 1 (No. 1). The case retrieval knowledge is made use of when coincidence is found in respect to the faulty component stated in the conditional part, wherein analysis is performed as to whether the remaining condition is satisfied, for thereby determining the faulty component which is the same as the precedent case.

The precedent trouble case knowledge is recorded in terms of "trouble number", "customer name", "data set name", "dump title", "product name", "date of occurrence" and "dump type". On the other hand, there are recorded at the trouble case number 1 "trouble number is not inputted yet", "customer name is not inputted yet", "data set name is indeterminate", "dump title is IOS-ERROR", "product name is VOS3/PS21", "occurrence date is indeterminate" and "dump type is SVC DUMP".

In the case of the instant embodiment, "running" is identified as the faulty component through the same procedure as that in the first embodiment to resume the step 401. Thereafter, the case retrieval routine is selected at a step 403. Through the case retrieval routine, the aforementioned precedent case retrieval knowledge having the faulty component coinciding with that of the current case is retrieved, whereon the column d of the table 3 which is the data not confirmed yet is read from the data base through the data reading routine 201. Since it is confirmed at a step 441 that the column d of the table 3 has a value of "1" it is decided that the current case now being diagnosed is the same as the precedent case identified by the trouble case number 1, whereon the precedent trouble case having the trouble case number 1 is retrieved to be displayed at a step 443.

Subsequently, the step 401 is regained, and "END" is selected to perform the end processing (step 401, 405). In the end processing, comment is prepared by the maintenance operator, whereon the comment as well as the content of the second file 202 containing the identified trouble case name, the same precedent case number "1" the data concerned and the result of interpretation thereof are transferred to the ninth file 111 containing the operation log information, which file is then stored in the seventh storage 308. The stored operation log information is automatically loaded into the fault diagnosis system upon every starting thereof and can be displayed in response to user's display request 211.

As will be appreciated from the above description, according to the sixth embodiment of the invention, measures for coping with the identified trouble can easily be taken because the information of the identified trouble is readily available from the same precedent case information retrieved and displayed. Further, by virtue of the operation log which is loaded in the fault diagnosis system upon start thereof, the re-analysis of a same component is avoided, which in turn means that when the diagnosis operation is restarted after interruption, time taken for the diagnosis can be reduced profitably. Further, by displaying the operation log, comment prepared by the operators in the past can be consulted, which facilitates handing-over of the diagnosis operation when conducted by a plurality of operators.

While the invention has been described in terms of its preferred embodiments, it should be understood that numerous modifications may be made thereto without departing from the spirit and scope of the invention as defined in the appended claims. It is intended that all such modifications fall within the scope of the claims.

What is claimed is:

1. A fault diagnosis method for specifically identifying a faulty component by using knowledge of fault diagnosis based on data expressing features or states of an objective under diagnosis, the method comprising the steps of:

provrding problem localizing knowledge for identifying a faulty component based on an operation principle of said objective under diagnosis, heuristic knowledge for localizing the faulty component based on available expertise, and meta-level diagnosis knowledge for determining a scheme of using said problem localizing knowledge and said heuristic knowledge; and, executing a reasoning for the faulty component of said objective under diagnosis through a combination of a reasoning based on the use of said problem localizing knowledge and a reasoning based on the use of said heuristic knowledge in accordance with said meta-level diagnosis knowledge by localizing the faulty component by omitting intermediate steps involved in the diagnosis which are determined in accordance with said heuristic knowledge based on data obtained during the diagnosis;

determining applicability of said omitting;

providing a stepwise execution mode in which a diagnosis processing is interrupted every time execution of one diagnosis step has been completed;

providing a one-path execution mode in which the diagnosis processing is interrupted every time one faulty component has been identified;

providing an all-path execution mode in which the diagnosis processing is terminated when all faulty components have been identified;

providing flags for discriminatively indicating diagnosis steps executed in said one-path execution mode and diagnosis steps executed in said all-path execution mode in association with said problem localizing knowledge;

detecting a flag indicating that a given diagnosis step to be executed has previously been executed from said flags upon identifying a faulty component either in said one-path execution mode or said all-path execution mode; and, aborting execution of said given diagnosis step while regarding the result of said execution as being unsuccessful when the detecting occurs.

2. A fault diagnosis system comprising:

at least one problem localizing unit;

at least one shortcut reasoning unit; and, a meta level control unit;

wherein each problem localizing unit includes problem localizing knowledge and problem localizing means for identifying stepwise a faulty component convergently by using the problem localizing knowledge and data of an objective under diagnosis;

wherein each shortcut reasoning unit includes heuristic knowledge and shortcut reasoning means for localizing the faulty component by omitting intermediate steps of those involved in the diagnosis using the heuristic knowledge on faulty diagnosis;

wherein said meta-level control unit includes meta level diagnosis means for deciding whether said shortcut reasoning unit is to be activated or not;

wherein said at least one problem localizing unit is operable by a first processor dedicated thereto and including means for storing said problem localizing knowledge and said problem localizing means;

wherein said at least one shortcut reasoning unit is operable by a second processor dedicated thereto and including means for storing said heuristic knowledge and said shortcut reasoning means; and, wherein said problem localizing unit and said shortcut reasoning unit are controlled by said metal-level diagnosis means operable by a third processor provided separately from said first and second processors.

* * * * *